United States Patent [19]
Sakai et al.

[11] Patent Number: 5,678,212
[45] Date of Patent: Oct. 14, 1997

[54] ELECTRONIC TUNING CIRCUIT FOR AN AM RECEIVER

[75] Inventors: Koichi Sakai; Ken Kasahara; Hajime Yokoyama; Noboru Takada; Yukio Suzuki, all of Tsurugashima, Japan

[73] Assignee: Toko Kabushiki Kaisha, Tokyo-to, Japan

[21] Appl. No.: 526,092

[22] Filed: Sep. 11, 1995

[51] Int. Cl.$^6$ .................................................. H04B 1/18
[52] U.S. Cl. .................... 455/193.3; 455/193.1; 455/180.4; 455/292
[58] Field of Search ................ 455/193.3, 193.1, 455/191.2, 180.4, 311, 296, 195.1, 280, 281, 283, 292, 169.2, 187.1; 334/15

[56] References Cited

U.S. PATENT DOCUMENTS

| | | | |
|---|---|---|---|
| 3,931,577 | 1/1976 | Barnett | 455/292 |
| 4,048,598 | 9/1977 | Knight | 455/193.3 |
| 4,186,350 | 1/1980 | Takayama | 455/193.3 |
| 4,218,774 | 8/1980 | Kondo | 455/292 |
| 4,224,471 | 9/1980 | Ogita | 455/280 |
| 4,339,827 | 7/1982 | Torres et al. | 455/193.3 |
| 4,430,630 | 2/1984 | Sakamoto | 455/283 |
| 4,742,569 | 5/1988 | Yokoyama et al. | 455/193.3 |
| 4,794,650 | 12/1988 | Yokoyama | 455/193.1 |
| 4,805,232 | 2/1989 | Ma | 455/292 |
| 4,837,852 | 6/1989 | Takada et al. | 455/193.3 |
| 5,040,239 | 8/1991 | Kondo et al. | 455/193.1 |

*Primary Examiner*—Thai Tran
*Assistant Examiner*—Aung S. Moe
*Attorney, Agent, or Firm*—Cushman Darby & Cushman IP Group of Pillsbury Madison & Sutro LLP

[57] ABSTRACT

An electronic tuning circuit for an AM radio receiver in which a signal of a specific frequency is selected from the input signal from an antenna is provided, this tuning circuit having a tuning transformer with a first winding and a second winding, the number of turns on the first winding being greater than the number of turns on said second winding, the input from the antenna being applied to the second winding of the tuning transformer, and further having two varactor diodes, each of which is connected in series with a DC-blocking capacitor, these series-connected varactor-capacitor combinations being connected in parallel with the first winding of the tuning transformer such that the polarities of the varactor diodes are mutually opposing.

8 Claims, 2 Drawing Sheets

5,678,212

ELECTRONIC TUNING CIRCUIT FOR AN AM RECEIVER

DETAILED DESCRIPTION OF THE INVENTION

Background of the Invention

1. Field of Utilization in Industry

The present invention relates to an electronic tuning circuit for an AM radio receiver, suitable for application to a car radio or the like, and more specifically it relates to an electronic tuning circuit for an AM radio receiver, which receives the input signal from an antenna by a tuning transformer, has a tuning circuit which uses a varactor diode, and outputs a signal to an RF amplifier.

2. Description of the Background Art

When receiving an AM broadcast signal with a car radio or the like, it is necessary to run a coaxial cable from an antenna to the receiver. Because of this cable, the capacitance seen from the receiver circuit reaches 60 to 80 pF. When a tuning circuit is implemented using a varactor diode to achieve tuning, this capacitance, which is applied in parallel to the tuning circuit, causes a compression of variable capacitance ratio. That is, because the above-noted capacitance is added to the capacitance of the varactor diode, the range of variable capacitance becomes narrower.

For this reason, it is not possible to achieve the 1-to-11 times variable capacitance ratio necessary to receive the AM broadcast band from 530 kHz to 1710 kHz, thereby preventing coverage of the entire AM broadcast band.

In addition, in the prior art excessively high level input signal caused non-linear distortion in the voltage vs capacitance characteristic of varactor diode, making it impossible to implement a tuning circuit to track the input frequency at the antenna input stage. This is because of the voltage added to the varactor diode when an excessive input signal is applied, causing instability in the varactor's capacitance value.

Lacking a tuning circuit, whole signals over the entire AM band received at the antenna are fed to the RF amplifier without being selected, causing the problem of the RF amplifier to saturate due to strong interfering signals.

SUMMARY OF THE INVENTION

In consideration of the above-described drawbacks in the prior art, an object of the present invention is to provide an electronic tuning circuit for an AM radio receiver which is capable of achieving a capacitance variable ratio sufficient to cover the entire AM broadcast band.

Another object of the present invention is to provide an electronic tuning circuit for an AM radio receiver in which non-linear distortion in the varactor diode is eliminated, thereby achieving low distortion and immunity to interference.

By providing an electronic tuning circuit as noted above, it is possible to selectively reject interfering signals, thereby preventing saturation of the following amplifier, and to reduce the transmission loss of the desired signal, thereby improving sensitivity.

The present invention is to achieve the above-noted objects by receiving the input from an antenna at the secondary side of a tuning transformer, and by using two varactor diodes and the connection method thereof.

Specifically, the present invention is an electronic tuning circuit for an AM radio receiver, this tuning circuit being inserted at the antenna input stage of the AM radio receiver and having a tuning transformer and two varactors, the secondary side of the tuning transformer which has a smaller number of turns of the winding being connected to the antenna, and the two varactor diodes being connected in parallel each other with their polarities mutually reversed at the primary side of the tuning transformer which has a greater number of turn of the winding.

By connecting the antenna to the secondary side of the tuning transformer and receiving the input signal at the secondary side of the tuning transformer, the equivalent capacitance converted to the primary side of the tuning transformer is reduced. That is, the transformer impedance is given by Equation (1).

$$C_a' = C_a (n_2/n_1)^2 \quad (1)$$

In the above, $n_1$ is the number of turns of the primary winding, $m_2$ is the number of turns of the secondary winding, $C_a$ is the secondary side capacitance, and $C_a'$ is the equivalent capacitance of $C_a$ converted as seen on the primary side.

Therefore, because the influence that the capacitance value added to the secondary side has on the primary side is proportional to the square of the inverse of the turns ratio of the transformer, it is possible to reduce the equivalent capacitance converted to the primary side by making the number of turns of the secondary winding smaller than the number of turns of the primary windings.

Additionally, because the influence of the equivalent capacitance converted to the primary side can be reduced by two varactors connected in parallel, it is possible to make the variable range of the combined tuning capacitance wide.

Due to the parallel connection of the varactor diodes with mutually opposite polarities, the non-linear distortions of the diodes occurring when they are subjected to excessive input signal cancel each other out so that it is possible to achieve a predetermined capacitance value.

DESCRIPTION OF THE PREFERRED EMBODIMENTS

The preferred embodiments of the present invention will next be described, with reference made to the accompanying drawings.

Figure 1:
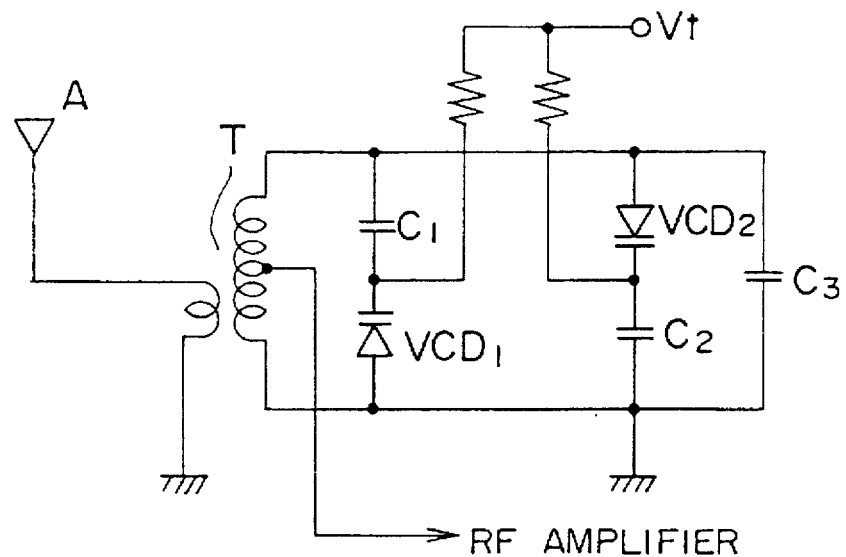
FIG. 1 is a circuit diagram showing the first embodiment of the present invention.

FIG. 1 is a circuit diagram which shows the first embodiment of the present invention. In a car radio or the like, an antenna A is connected to a tuning transformer T by means of a coaxial cable. The secondary side of the tuning transformer T connected in series with the antenna. The secondary side and primary side of the tuning transformer T, there being a prescribed turns ratio relating the primary winding and the secondary winding of this transformer, such that the number of turns on the secondary side is smaller than the number of turns on the primary side.

The varactor diode $VCD_1$ and the varactor diode $VCD_2$ are connected in parallel to the primary side of the tuning transformer T. The varactor diodes are connected so that their polarities are mutually opposite, that is, so that the forward direction of one is directed toward one end of the transformer winding and the forward direction of the other is directed toward the other end of the transformer winding.

The tuning control voltage Vt is applied to the varactor diodes $VCD_1$ and $VCD_2$. Two varactor diodes $VCD_1$ and $VCD_2$ having nearly the same characteristics are used. The capacitors $C_1$ and $C_2$ are used to block a DC component and have a capacitance value that is sufficiently large in comparison with the capacitance value of varactor diodes $VCD_1$ and $VCD_2$, so that they do not influence the tuning capacitance of the circuit. Capacitance $C_3$ represents stray capacitance, which adjusts the variable ratio of the tuning capacitance. The tuning control voltage Vt is applied through resistances to the connecting points between the capacitor $C_1$ or $C_2$ and the cathode of the varactor diode $VCD_1$ or $VCD_2$, respectively.

The tuning circuit is formed by the above-noted tuning transformer T, the two varactor diodes $VCD_1$ and $VCD_2$, and the capacitance $C_3$. The tap on the primary winding of the tuning transformer T is connected to an RF amplifier and outputs the tuned signal.

Figure 2:
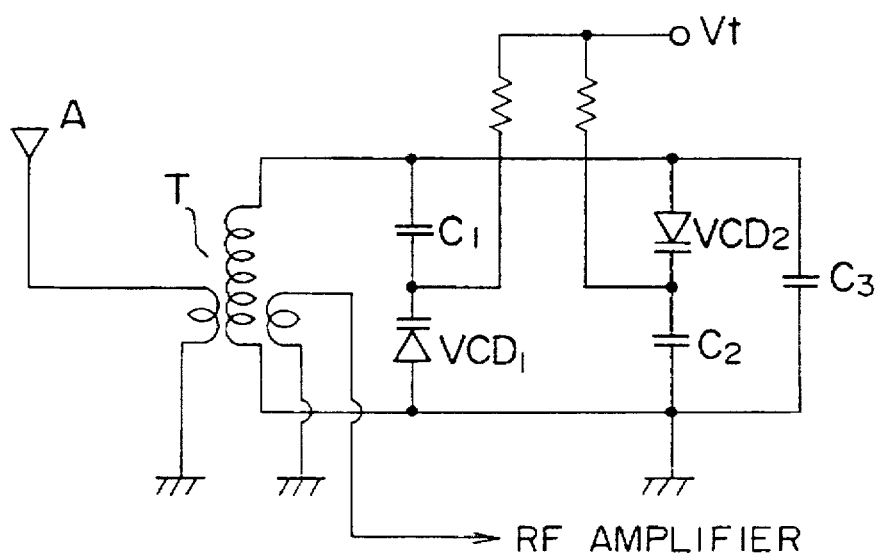
FIG. 2 is a circuit diagram showing the second embodiment of the present invention.
Figure 3:
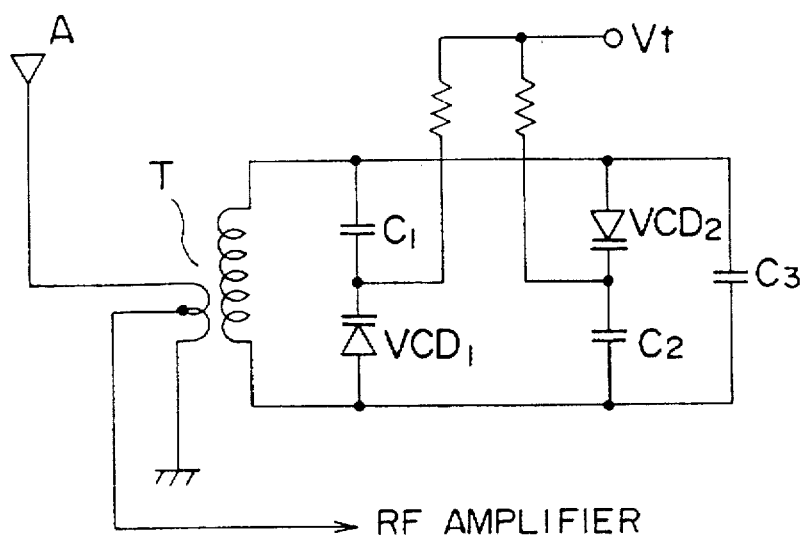
FIG. 3 is a circuit diagram showing the third embodiment of the present invention.
Figure 4:
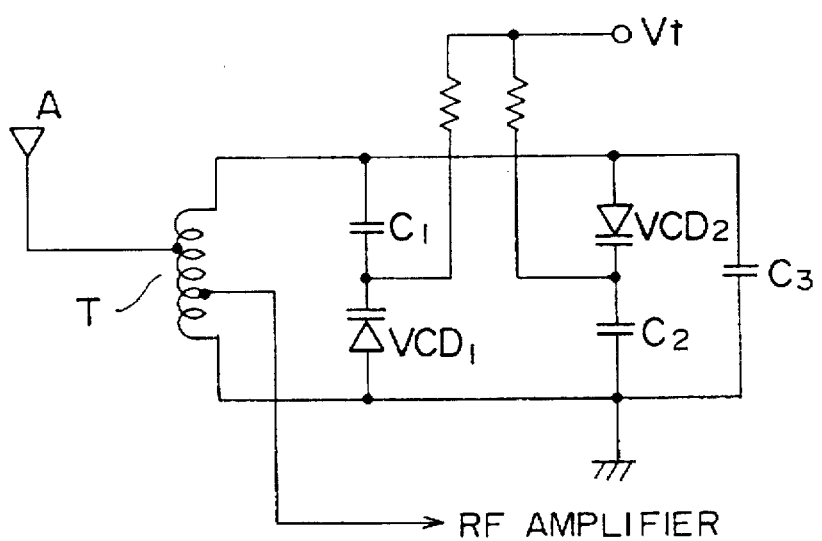
FIG. 4 is a circuit diagram showing the fourth embodiment of the present invention.

A variety of types of tuning transformers can be applied to the present invention. For example, as shown in FIG. 2, it is possible to use a transformer in which a separate winding is coupled to the primary winding. Also, as shown in FIG. 3, it is possible to use a transformer having a tap provided on the secondary winding or, as shown in FIG. 4, a transformer can be used in which part of the primary winding is shared with the secondary winding.

In the case in which a transformer having a separate winding which is coupled to the primary winding is used, this additional winding is connected to the RF amplifier for output of the tuned signal. In the case in which a transformer having a tap provided on the secondary winding is used, this tap is connected to the RF amplifier for output of the tuned signal. In the case in which a transformer in which part of the primary winding is shared with the secondary winding is used, a tap can be provided in either winding, this tap being connected to the RF amplifier for output of the tuned signal.

The capacitive components of the antenna and the coaxial cable both added to the input side of the receiver are connected to the secondary side of the tuning transformer whose primary side forms a tuning circuit with capacitive components which appear at the primary side as equivalent capacitances converted by the tuning transformers. Therefore, an equivalent capacitance converted to the primary side can be reduced considerably. The capacitance at the secondary side is usually 80 pF, and is reduced to 20 pF at the primary side through the conversion of the tuning transformer. As the two varactor diodes are connected parallelly with the capacitance at the primary side, the variable range of capacitance is made wide. Because the two varactor diodes are connected in parallel with their polarities mutually opposite, as described above, this connection is such that the AC signal voltage induced in the tuning circuit is applied to these varactor diodes in a mutually opposite polarity. With respect to an excessive input signal, because the variations in these varactor diodes are mutually opposite, the non-linear distortion of the varactor diodes is canceled out.

Furthermore, forward current flows in the varactor diodes with respect to an extremely excessive input signal, so that they serve as a clamping circuit.

According to the present invention as described above, because the antenna is connected to the secondary side of the tuning transformer and two varactor diodes are connected in parallel, it is possible to achieve a high capacitance variable ratio. By doing so, it is possible to achieve a capacitance variable ratio sufficient to cover the entire AM broadcast band.

Additionally, because the above arrangement eliminates the non-linear distortion of the two varactor diodes with respect to excessive input signal, it is possible to achieve a tuning circuit with little distortion and interference.

By achieving the above-noted effect, interfering signals are selectively rejected by the tuning circuit, so that saturation of the subsequent RF amplifier stage is prevented.

Because a tuning circuit according to the present invention achieves tuning including the capacitance of the coaxial cable, it offers the advantage of decreased signal transmission loss due to the coaxial cable and improved receiving selectivity.

What is claimed is:

1. An electronic tuning circuit for an AM radio receiver in which a signal of a specific frequency is selected from the input signal from an antenna, said electronic tuning circuit comprising:

a tuning transformer having a first winding and a second winding, the number of turns on said first winding being greater than the number of turns on said second winding; and two varactor diodes, each of which being connected in series with a DC-blocking capacitor, these series-connected varactor-capacitor combinations being connected in parallel with said first winding of said tuning transformer such that the polarities of said varactor diodes are mutually opposing.

2. An electronic tuning circuit for an AM radio receiver according to claim 1, wherein said two varactor diodes have nearly the same voltage versus capacitance characteristics.

3. An electronic tuning circuit for an AM radio receiver according to claim 1, wherein said antenna and said tuning transformer are connected by a coaxial cable.

4. An electronic tuning circuit for an AM radio receiver according to claim 1, wherein a part of said first winding of said tuning transformer is shared with said second winding of said tuning transformer.

5. An electronic tuning circuit for an AM radio receiver in which a signal of a specific frequency is selected from an input signal from an antenna, said electronic tuning circuit comprising:

a tuning transformer having a first winding and a second winding, said second winding receiving said input signal from said antenna, said first winding being coupled to said second winding, the number of turns of said first winding being greater than the number of turns of said second winding; and two varactor diodes, each of which is connected in series with a DC-blocking capacitor, these series-connected varactor-capacitor combinations being connected in parallel with said first winding of said tuning transformer such that the polarities of said varactor diodes are mutually opposing, a tuning control voltage being applied to said varactor diodes so that a signal of a desired frequency is extracted from said first winding of said tuning transformer.

6. An electronic tuning circuit for an AM radio receiver according to claim 5, wherein said two varactor diodes have nearly the same voltage versus capacitance characteristics.

7. An electronic tuning circuit for an AM radio receiver according to claim 5, wherein said antenna and said tuning transformer are connected by a coaxial cable.

8. An electronic tuning circuit for an AM radio receiver according to claim 5, wherein a part of said first winding of said tuning transformer is shared with said second winding of said tuning transformer.

* * * * *